United States Patent [19]
McAnally et al.

[11] Patent Number: 5,999,416
[45] Date of Patent: Dec. 7, 1999

[54] COVER/SHIELD ASSEMBLY FOR ELECTRONIC COMPONENTS

[75] Inventors: Andrew McAnally; Stephen Cook, both of Georgetown; Timothy Radloff, Austin, all of Tex.

[73] Assignee: Dell Computer Corporation, Round Rock, Tex.

[21] Appl. No.: 08/777,740

[22] Filed: Dec. 20, 1996

[51] Int. Cl.[6] .................................................. H05K 9/00
[52] U.S. Cl. .......................... 361/816; 361/683; 361/753; 361/796; 361/800; 361/801; 174/35 R
[58] Field of Search .................................... 361/683, 724, 361/725, 726, 752, 818, 816, 732, 736, 740, 747, 748, 753, 756, 759, 796, 799, 800, 801, 802; 174/35 R; 312/223.2

[56] References Cited

U.S. PATENT DOCUMENTS

| | | | |
|---|---|---|---|
| 4,399,316 | 8/1983 | Woodward | 174/35 GC |
| 4,672,510 | 6/1987 | Castner | 361/686 |
| 4,717,990 | 1/1988 | Tugcu | 361/816 |
| 5,206,796 | 4/1993 | Thompson et al. | 361/818 |
| 5,349,132 | 9/1994 | Miller et al. | 174/35 R |
| 5,392,192 | 2/1995 | Dunn et al. | 361/683 |
| 5,420,760 | 5/1995 | Ansell et al. | 361/818 |
| 5,495,399 | 2/1996 | Gore et al. | 361/814 |
| 5,661,640 | 8/1997 | Mills et al. | 361/801 |

*Primary Examiner*—Donald Sparks
*Assistant Examiner*—Jayprakash N. Gandhi
*Attorney, Agent, or Firm*—Haynes & Boone, L.L.P.

[57] ABSTRACT

A cover/shield assembly for an electronic component such as a computer system. The assembly includes a cover and relatively strong and rigid metal shield which shields against electromagnetic and radio frequency interference and which is attached to the inner surface of the cover, yet can easily be separated from the cover for recycling purposes. The shield is formed by a plate and a reinforcing beam connected to the plate. A series of hooks and tabs on the cover extend through slots in the shield and the shield is provided with tabs which engage ribs on the cover, all for the purpose of quick-detachably connecting the shield to the cover.

19 Claims, 6 Drawing Sheets

COVER/SHIELD ASSEMBLY FOR ELECTRONIC COMPONENTS

TECHNICAL FIELD

The invention relates generally to the field of electronic equipment, such as computers, and the like and, more particularly, to a structurally reinforced, cover/shield assembly for the components.

BACKGROUND

Many types of electronic components, such as computers, utilize plastic housings and covers since plastic provides improved cosmetics and design flexibility. However, plastic has the major disadvantage of being susceptible to the deleterious effects of electromagnetic and radio frequency interference. To this end, several techniques have evolved for providing proper shielding for plastic components, yet not significantly add to the size, weight and cost of the component. For example, according to one technique, one or more of the outer plastic parts of the component are coated with conductive material. Alternately, metal shielding has been used which is permanently attached to the plastic housing or cover.

Some electronic components must also be relatively rigid and strong.

For example, a computer, and, more specifically, a central processing unit (CPU) having a plastic housing and cover, must be strong and rigid enough to support a monitor. However, the above-described technique of coating the cover with conductive material does not appreciably add to the strength of the cover. Metal shielding, although providing added strength and rigidity, is very difficult to separate from the cover in the event the shielding is to be reused or recycled.

Therefore what is needed is a cover/shield assembly for a computer, or other electronic component, which is adequately shielded, yet is strong and rigid enough to support a monitor, or the like, and permits the shield to be easily and quickly separated from the cover so that it can be reused or recycled.

SUMMARY

The cover/shield assembly, accordingly, includes a relatively strong and rigid metal shield which shields against electromagnetic and radio frequency interference and which is attached to the inner surface of the cover of the component, yet can easily be separated from the cover for recycling purposes. To this end, the shield includes a plate and a reinforcing beam connected to the plate. A series of hooks and tabs on the cover extend through slots in the shield and the shield is provided with tabs which engage ribs on the cover, all for the purpose of quick-detachably connecting the shield to the cover.

DETAILED DESCRIPTION OF THE PREFERRED EMBODIMENTS

Figure 1:
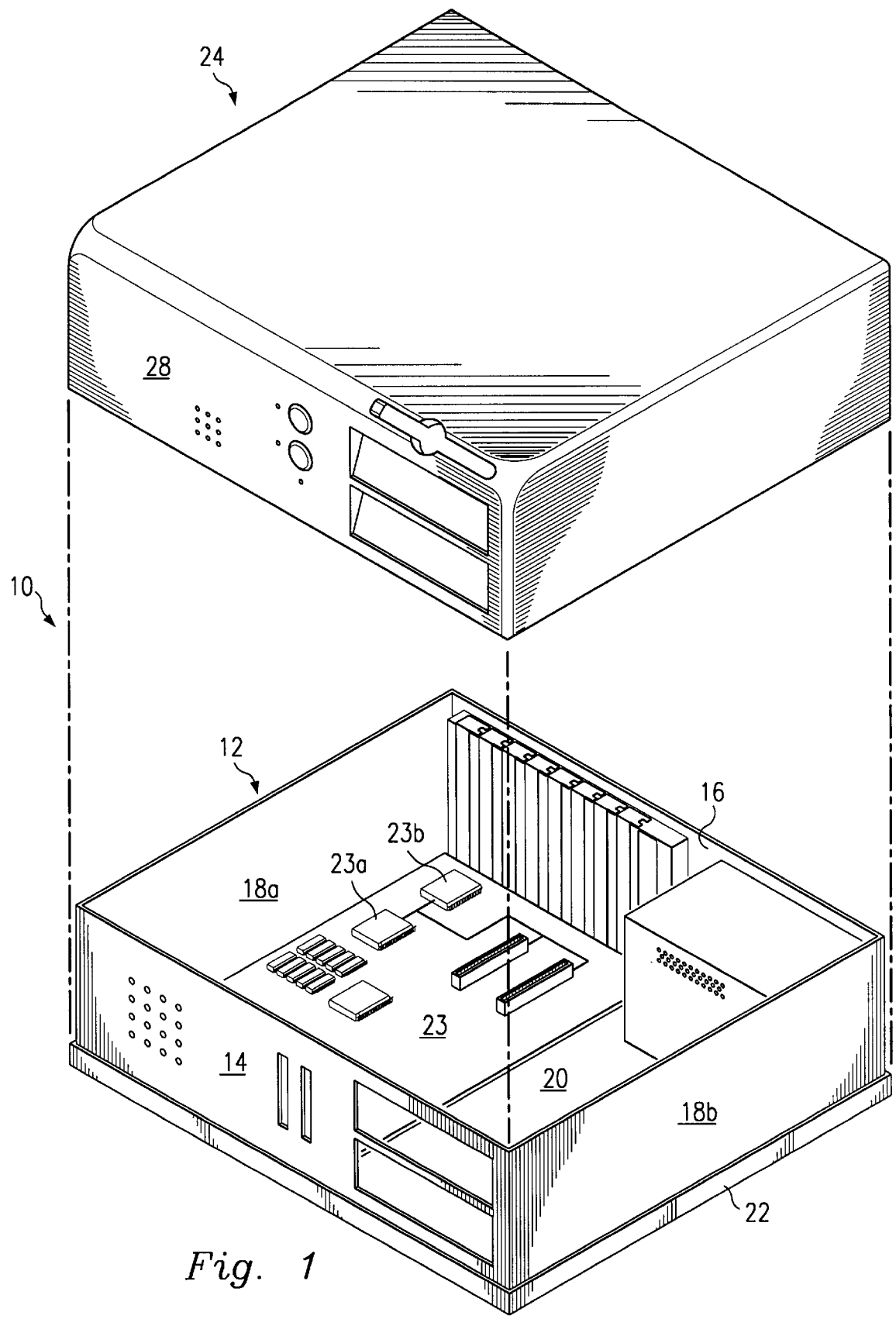
FIG. 1 is an isometric exploded view of an equipment enclosure including a cover/shield assembly.

Referring to FIG. 1 of the drawing, the reference numeral 10 refers, in general, to an electronic component, which, for the purposes of example is in the form of a desktop computer system, having a chassis, or inner enclosure, 12 formed by a front wall 14, a rear wall 16, two sidewalls 18a and 18b, and a bottom wall, or floor, 20. The chassis 12 is normally formed of metal and has a plastic bottom plate 22 extending over the bottom wall 20. The edge portions of the bottom plate 22 extend upwardly, as viewed in FIG. 1 to form flanges 22 that extend over the lower portions of the walls 14, 16, 18a and 18b. A motherboard 23 is mounted to the floor 20 and is interconnected in a conventional manner to components of the computer system, which components include a microprocessor 23a and a memory 23b mounted on the motherboard.

The cover/shield assembly is shown by the reference number 24, and normally extends over the enclosure chassis 12 with the lower edges of the assembly abutting the upper edges of the flanges 22. The assembly 24 includes a plastic outer cover 26 which is shown in detail in FIG. 2 and which is formed by a front wall 28, two sidewalls 30 and 32, and a top plate 34 (shown inverted in FIG. 2). When the cover/shield assembly 24 is placed over the chassis 12, the front wall 28 and the sidewalls 30 and 32 extend over the front wall 14 and the sidewalls 18a and 18b, respectively, of the chassis 12 (FIG. 1) and rest on the upper ends of the flanges 22. It is understood that the cover/shield assembly 24 is connected to the chassis 12 in any conventional manner.

Figure 2:
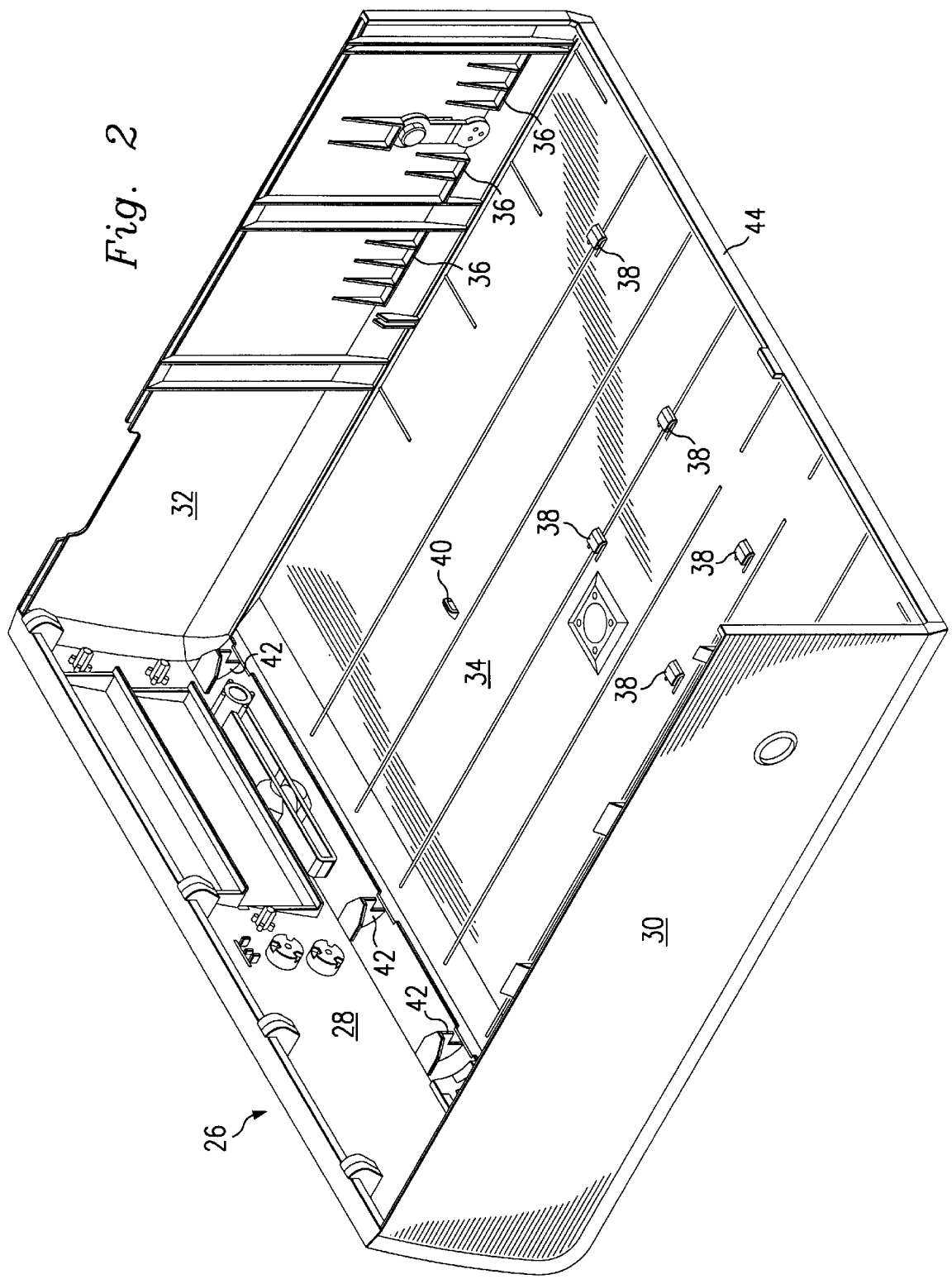
FIG. 2 is an inverted isometric view of the cover of the cover/shield assembly of FIG. 1.

As shown in FIG. 2, three horizontally-extending ribs 36 are formed on the inner surface of the sidewall 32, and, although not shown in FIG. 2, it is understood that three ribs identical to the ribs 36 are also formed on the inner surface of the sidewall 30. The ribs 36 are for the purpose of receiving tabs on a metal shield (not shown in FIG. 2) to be connected to the cover 26, as will be explained.

Seven retention hooks 38 (five of which are shown in FIG. 2) and two stop tabs 40 (one of which is shown) extend upwardly, as viewed in FIG. 2, from the inner surface of the top plate 34 for extending in corresponding slots in the above-mentioned metal shield. Four ribs 42 (three of which are shown in FIG. 2) project outwardly from the inner surface of the front wall 28 of the cover 26 for receiving tabs on the metal shield.

The end portion of the top plate 34 extends upwardly to form a flange 44 extending at a right angle to the plate to stiffen the latter end portion and better support the above-mentioned metal shield. Although not shown in FIG. 2, an inwardly-extending rib is formed on the inner surfaces of the end portions of the flange to engage the end portions of a flange provided on the metal shield, all of which will be shown and described in detail later.

Figure 3:
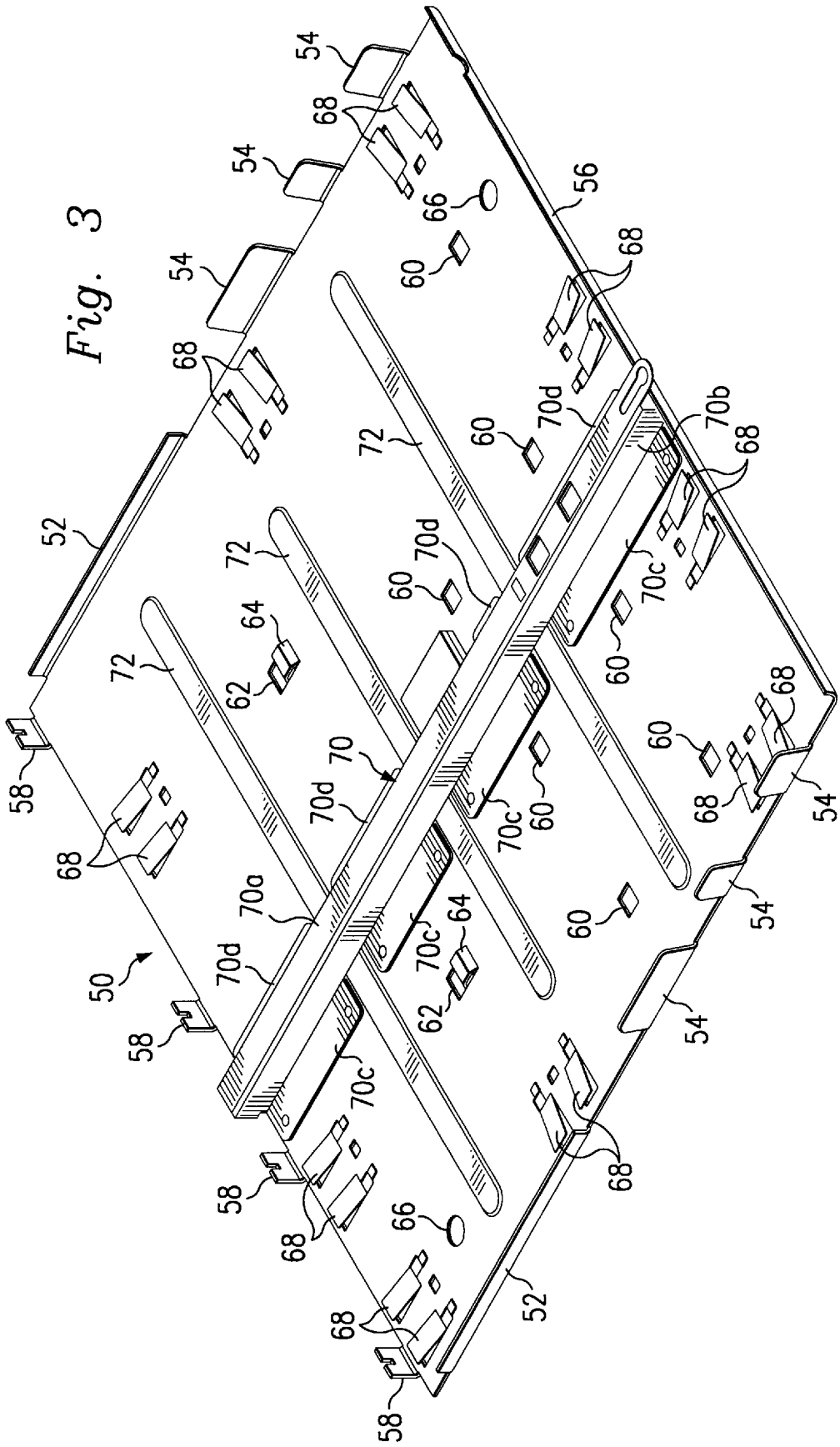
FIG. 3 is an isometric view of the shield of the cover/assembly of FIG. 1.

With reference to FIG. 3, the above-mentioned metal shield is shown in general by the reference numeral 50 and is in the form of a flat plate having a length and width substantially corresponding to the length and width of the top plate 34 of the cover. Two elongated tabs 52 extend from the two opposite side edge portions of the shield 50 and engage the sidewalls 30 and 32 (FIG. 2) of the cover 26 to stabilize the shield when the shield is connected to the cover in a manner to be described. Three spaced tabs 54 also extend from both of the opposite side edge portions of the shield 50 and are designed to snap into engagement with the ribs 36 (FIG. 2) on the cover 26 when the shield is connected to the cover. The tabs 54 also stiffen the sides of the cover 26 and, in addition, block apertures in the interface between the assembly 24 and the chassis 12 (FIG. 1) in their assembled condition to help reduce noise caused by electromagnetic and radio frequency interference.

The end portion of the shield 50 is bent upwardly to form a flange 56 which stiffens the latter end portion. The flange 56 engages the flange 44 on the cover 26 in the assembled condition of the cover/shield assembly 24 and provides support for the assembly when it is picked up by the cover 26 in the manufacturing process. The respective ends of the flange 56 engage the above-mention ribs formed on the inner surfaces of the end portions of the flange 44 to aid in securing the shield 50 to the cover 26, as will be further described.

Four tabs 58 are formed on the front end of the shield 50 and extend upwardly as viewed in FIG. 3, for engaging the ribs 42 (FIG. 2) on the front plate 28 of the cover 26, to aid in securing the shield to the cover.

Seven rectangular slots 60 are provided through the shield 50 for receiving the retention hooks 38 (FIG. 2) on the top plate 34 of the cover 26 to guide and secure the shield 50 relative to the cover 26. Similarly, two rectangular slots 62 are provided through the shield 50 for receiving the stop tabs 40 (FIG. 2) on the top plate 34, also to guide and secure the shield relative to the cover 26. Portions of the shield 50 extending immediately adjacent the slots 62 are cut and bent to form two 64 ramps, respectively, to aid in assembling the shield 50 from the cover 26, as will be explained. Nine pairs of clips 68 for electromagnetic grounding are inserted in corresponding slots in the shield.

A metal cross beam 70 extends from front to rear of the shield 50 and midway between its side edges, and is formed by a top wall 70a and two sidewalls, one of which is shown by the reference numeral 70b. Portions of the sidewall 70b are extended and bent at right angles to the sidewall to form four spaced mounting flanges 70c. The mounting flanges 70c are connected to the inner surface of the shield 50 in any known manner, such as by rivets, or the like. The other sidewall of the beam 70 is fabricated in an identical manner to form four additional mounting flanges 70d extending on the opposite sides of the beam 70 from the mounting flanges, 70c. Three rib-like embossments 72 extend across the shield 50 and are spaced along the length of the shield to add strength to the shield across its width.

Figure 4:
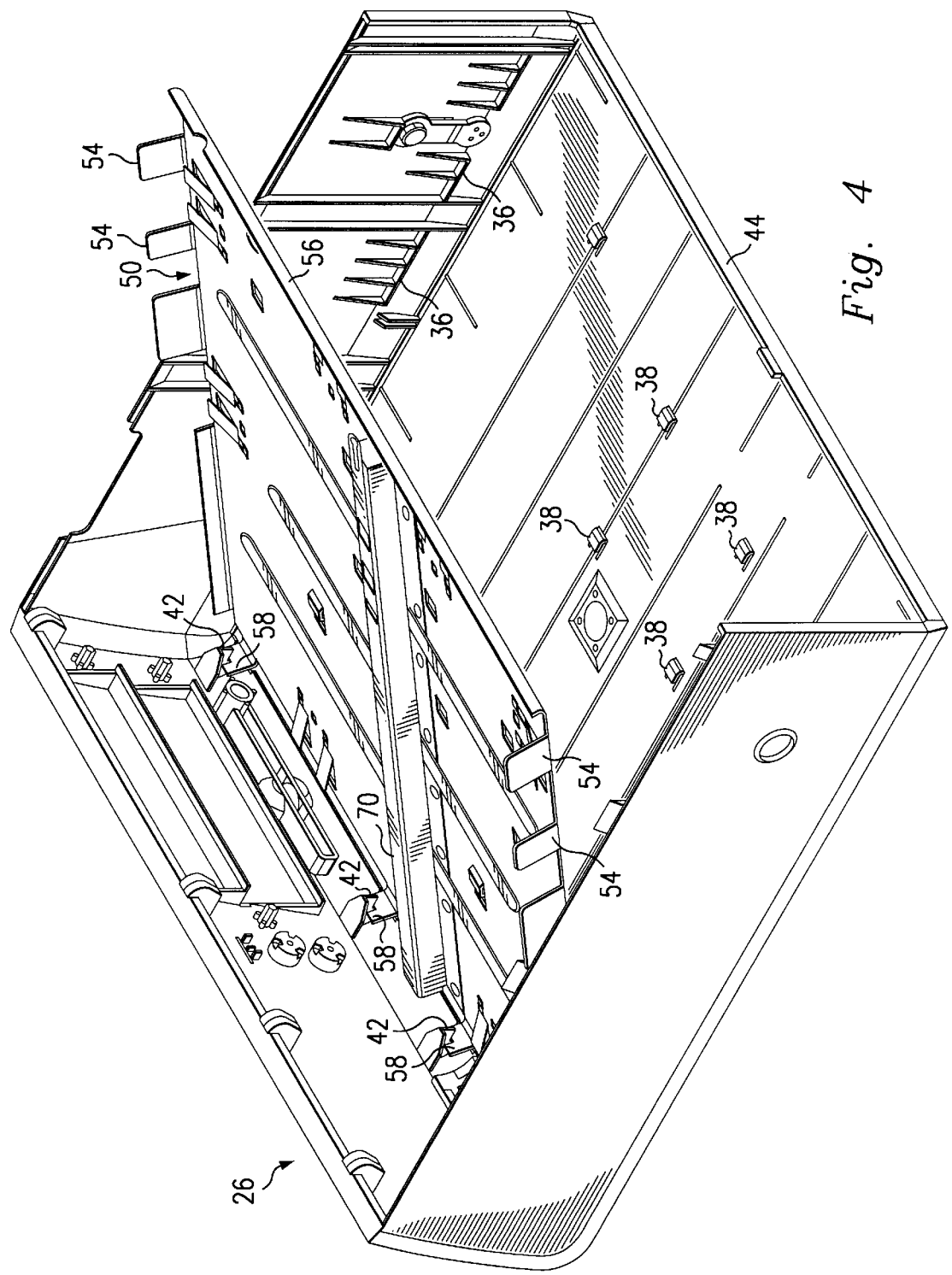
FIG. 4 is an isometric view of the cover and shield of FIGS. 2 and 3, respectively, during assembly of the shield to the cover.

To assemble the shield 50 to the cover 26, the shield is initially placed in the position relative to the cover shown in FIG. 4. In this position the tabs 58 on the shield extend under the ribs 42 on the cover and the shield is held at an angle (preferably between 30 and 45 degrees) to the cover. The trailing, or rear, end of the shield 50 is then rotated down towards the cover 26 as viewed in FIG. 4, until the shield fully engages the cover. In this position the side tabs 54 on the shield 50 engage the lower surfaces of the ribs 36 of the cover 26, and the hooks 38 of the cover 26 extend in the slots 60, respectively, of the shield 50. Although not shown in the drawings, the hooks 58 would initially be located in the trailing, or rear, end portions of the slots 60 where they "clear" the slots. Also, the stop tabs 40 would extend below their corresponding ramps 64, thus enabling the shield 50 to lie flat on the top plate 34 of the cover 26.

Figure 5:
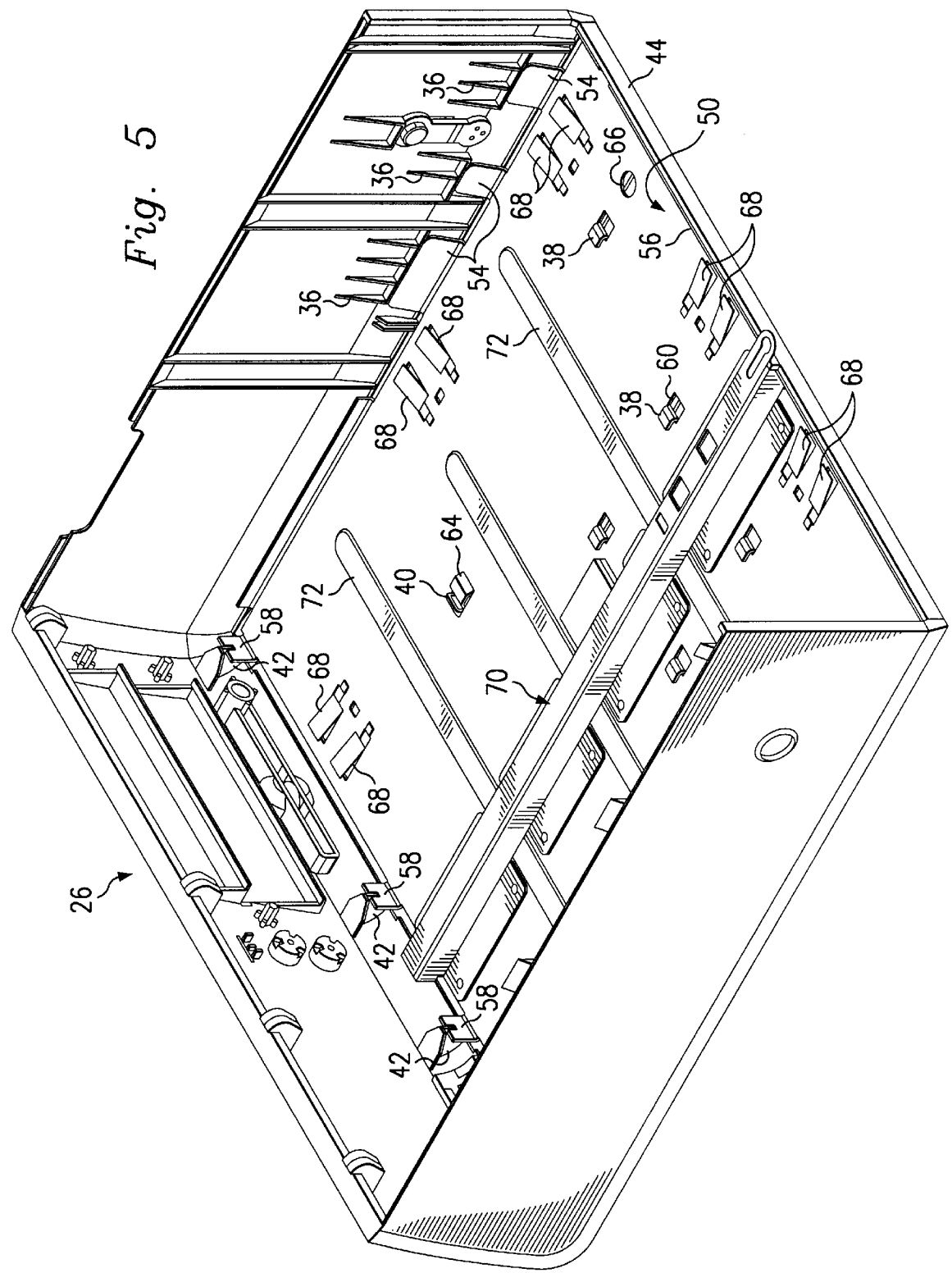
FIG. 5 is an isometric view of the assembled cover/shield assembly of FIG. 4.

The shield 50 is then moved towards the trailing, or rear end of the cover 26 until it reaches the fully assembled position shown in FIG. 5. In this position, the stop tabs 40 of the cover 26 snap into a locked position in the slots 62 in the shield 50 and the hooks 38 in the cover 26 move to the front, or leading end portions of their respective slots 60. In this position a portion of each hook 38 extends over the shield 50 to lock the shield against upward movement relative to the cover 26, as viewed in FIG. 5.

Figure 6:
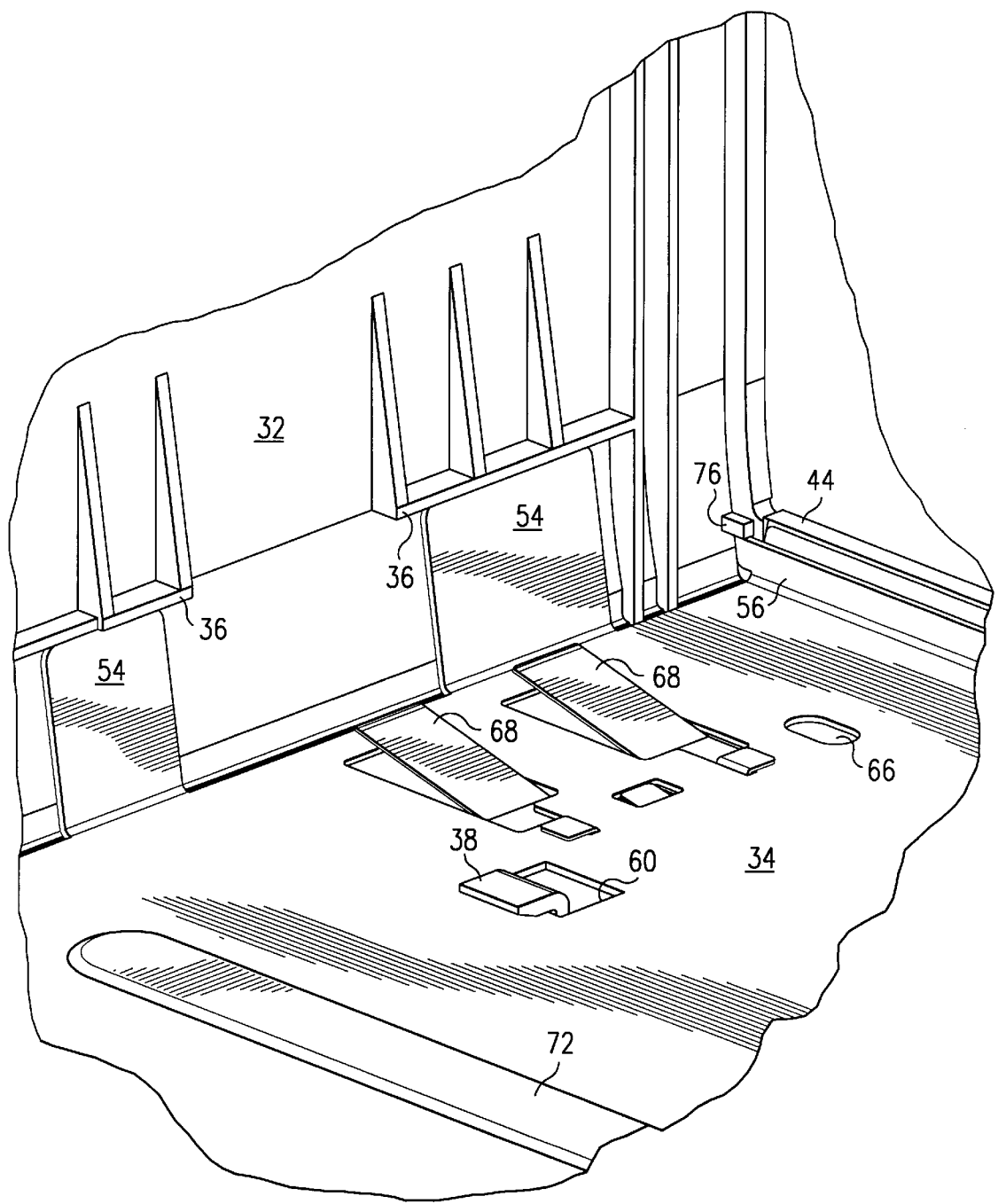
FIG. 6 is an enlarged isometric view of a portion of the cover/shield assembly of FIG. 5.

As shown in FIG. 6, in the assembled condition of the assembly 24, the corresponding end portions of the flange 56 of the shield 50 extend under two ribs, one of which is shown by the reference numeral 76, formed at the respective ends of the flange 44. This prevents upward movement of the shield, as viewed in FIG. 6, and thus also aids in retaining the shield to the cover 26. It is understood that a rib identical to the rib 76 is also formed at the other end of the flange 44 which also retains the corresponding end of the flange 56.

The shield 50 is easily removed from the cover 26 by inserting a flat blade or screwdriver in the slots 62 (FIG. 3) immediately adjacent their corresponding stop tabs 40 (FIG. 5). The blade is then use to apply upward pressure to the corresponding portion of the shield using the ramps 64 as pivot points until the stop tabs 40 clear their respective slots, 62. After the stop tabs 40 are so disengaged, the shield 50 is moved relative to the cover 26 towards the front wall 28 of the cover 26 until the slots 60 on the shield clear their respective hooks 38 on the cover. The sidewalls 30 and 32 of the cover 26 are then pushed outwardly, or apart, until the tabs 54 of the shield clear the corresponding ribs 36 of the cover 26. Then the trailing, or rear, end of the shield 50 is then raised relative to the cover 26 to the position of FIG. 4 and the shield can then be pulled further to the rear to clear the tabs 58 of the shield from the ribs 42 of the cover.

The cover/shield assembly thus enjoys several advantages. For example, in the assembled position of FIG. 5, the assembly 10 is adequately shielded, yet is strong and rigid enough to support a monitor, or the like. Also, the shield 50 can be quickly attached to the cover 26 with a minimum of effort. Further, the disengagement of the shield 50 from the cover 26 can also be done relatively easily and quickly to enable the metal shield to be reused or recycled.

It is understood that the cover/shield assembly 10 is not limited to use with a computer as described above by means of example, but is equally applicable to many other electrical components.

It is also understood that the embodiment of the assembly described above is intended to illustrate rather than limit the invention, and that the mounting assembly can take many other forms and embodiments within the scope of the invention.

What is claimed is:

1. A computer system comprising:

a chassis;

a microprocessor mounted to the chassis;

a memory operably connected to the microprocessor; and a cover/shield assembly for the chassis, the assembly comprising a cover, and a quick-detachable shield removably connected to the cover for shielding against electromagnetic and radio frequency interferences, the shield comprising a plate and a reinforcing beam extending from the plate.

2. The computer system of claim 1 wherein the cover comprises a top plate, and wherein the length and width of the plate of the shield substantially corresponds to the length and width of the top plate.

3. The computer system of claim 2 wherein the beam extends across the entire length of the plate of the shield and midway between its sides.

4. The computer system of claim 2 wherein a plurality of tabs are formed on the top plate of the cover, and a plurality of corresponding slots are formed through the plate of the shield for respectively receiving the tabs to quick detachably connect the plate to the cover.

5. The computer system of claim 2 wherein a plurality of hooks are formed on the top plate of the cover, and a plurality of corresponding slots are formed through the plate of the shield for respectively receiving the hooks to quick detachably connect the plate to the cover.

6. The computer system of claim 5 wherein the slots are longer than the hooks so that the hooks can be inserted through one end portion of their respective slots and the plate moved relative to the cover so that the hooks do not clear the slots.

7. The computer system of claim 2 further comprising a plurality of walls extending from the top plate of the cover, a plurality of ribs formed on at least one of the walls, and a plurality of tabs formed on the plate of the shield for engaging the ribs to connect the plate to the cover.

8. The computer system of claim 1 further comprising a plurality of mounting flanges extending from the beam for mounting the beam to the plate of the shield.

9. A computer comprising:

a chassis;

a microprocessor mounted to the chassis;

a memory operably connected to the microprocessor; and a cover/shield assembly for the chassis, the assembly comprising a cover comprising a top plate and a plurality of hooks extending from the top plate; each of the hooks having a vertical component and a horizontal component, and a quick-detachable shield removably connected to the cover for shielding against electromagnetic and radio frequency interferences, the shield comprising a plate having a plurality of slots extending therethrough for receiving the hooks, the horizontal component of the hook extending over and engaging the plate of the shield to quick detachably connect the plate to the top plate of the cover.

10. The computer of claim 9 wherein the slots are longer than the hooks so that the hooks can be inserted through one end portion of their respective slots and the plate moved relative to the cover so that the hooks do not clear the slots.

11. The computer of claim 9 wherein the length and width of the plate of the shield substantially corresponds to the length and width of the top plate.

12. The computer of claim 9 further comprising a plurality of walls extending from the top plate of the cover, a plurality of ribs formed on at least one of the walls, and a plurality of tabs formed on the plate of the shield for engaging the ribs to connect the plate to the cover.

13. The computer of claim 9 further comprising a reinforcing beam extending across the entire length of the plate of the shield and midway between its sides.

14. The computer of claim 9 further comprising a plurality of mounting flanges extending from the beam for mounting the beam to the plate of the shield.

15. A computer comprising:

a chassis;

a microprocessor mounted to the chassis;

a memory operably connected to the microprocessor; and a cover/shield assembly for the chassis, the assembly comprising a cover comprising a top plate, a plurality of walls extending from the top plate, and a plurality of ribs formed on and extending from at least one of the walls; and a quick-detachable shield removably connected to the cover for shielding against electromagnetic and radio frequency interferences, the shield comprising a plate and a plurality of tabs formed on and extending perpendicularly out from the plate of the shield for engaging a corresponding surface of the ribs to removably connect the to plate the cover.

16. The computer of claim 15 wherein the ribs extend parallel to the plates and wherein the tabs extend between the plate of the shield and the ribs.

17. The computer of claim 15 wherein the length and width of the plate of the shield substantially corresponds to the length and width of the top plate.

18. A method of connecting a plate to the inner surface of a cover, the method comprising the steps of:

providing at least one rib on one wall of the cover, providing at least one tab on an end portion of the plate, providing at least one hook on the cover, the hook having a vertical component and a horizontal component, providing at least one slot on the plate, placing the plate at an angle to the cover while inserting the tabs underneath the ribs, pivoting the plate towards the cover until the plate fully engages the cover and the hook extends in one end portion of the slot, and then moving the plate relative to the cover until the horizontal component of the hook extends over and engages the plate at the other end portion of the slot to removably secure the plate to the cover.

19. A computer comprising:

a chassis;

a microprocessor mounted to the chassis;

a memory operably connected to the microprocessor; and a cover/shield assembly for the chassis, the assembly comprising:

a cover comprising:
(i) a top plate,
(ii) a plurality of hooks extending from the top plate, each hook having a vertical component and a horizontal component,
(iii) a plurality of walls extending from the top plate,
(iv) a plurality of ribs formed on and extending from at least one of the walls, and a quick-detachable shield removably connected to the cover for shielding against electromagnetic and radio frequency interferences, the shield comprising:
(i) a plate,
(ii) a plurality of slots extending through the plate for receiving the hooks of the cover, the horizontal component of each hook extending over and engaging the plate to quick-detachably connect the plate of the shield to the cover,
(iii) a reinforcing beam extending from the plate, and
(iv) a plurality of tabs formed on and extending perpendicularly out from the plate of the shield for engaging a corresponding surface of the ribs to removably connect the plate to the cover.

* * * * *